United States Patent [19]

Boettner et al.

[11] 4,451,770

[45] May 29, 1984

[54] METHOD AND APPARATUS FOR DETERMINING THE RESISTANCE OF AN AC MOTOR STATOR

[75] Inventors: Fred H. Boettner, Salem; John H. Cutler, Roanoke; Loren H. Walker, Salem, all of Va.

[73] Assignee: General Electric Company, Salem, Va.

[21] Appl. No.: 493,405

[22] Filed: May 11, 1983

[51] Int. Cl.³ .............................................. H02P 3/18
[52] U.S. Cl. .................................. 318/757; 318/798; 318/806
[58] Field of Search ............... 318/798, 806, 757, 759, 318/803, 807–811; 324/158 MG

[56] References Cited

U.S. PATENT DOCUMENTS

| | | | |
|---|---|---|---|
| 4,023,083 | 10/1977 | Plunkett | 318/810 |
| 4,245,181 | 1/1981 | Plunkett | 318/805 |
| 4,282,473 | 8/1981 | Dreiseitl et al. | 318/803 |

Primary Examiner—David Smith, Jr.
Attorney, Agent, or Firm—Arnold E. Renner

[57] ABSTRACT

A scheme for determining the stator resistance of an alternating current motor includes the determination of the actual flux of the motor through the sensing of motor voltage and motor current. The motor current is also utilized to develop a signal representing the anticipated motor flux which will result from that current. These two flux signals are combined to develop a flux error signal, the polarity of which is determined by whether the motor is in the motoring or regenerative mode of operation, which in turn is integrated to give the signal representing the motor stator resistance. Additionally, when the motor changes mode of operation, there is provided a step function which assures a motor stator resistance value being used which insures control stability.

24 Claims, 2 Drawing Figures

METHOD AND APPARATUS FOR DETERMINING THE RESISTANCE OF AN AC MOTOR STATOR

BACKGROUND OF THE INVENTION

The present invention relates generally to motor control systems and more particularly to a method and apparatus for developing a signal representing the value of motor resistance through the sensing of motor voltages and currents.

There are a number of instances in which it is desirable to know the resistance of the stator of an alternating current (ac) motor. For example, in developing a thermal model of the motor, knowledge of the instantaneous stator resistance is often necessary. In many motor control systems a knowledge of the extant motor resistance is also necessary.

The determination of motor resistance in the quiescent state is, of course, a simple matter. One need merely apply a known direct current (dc) voltage to the stator winding, measure the current and, using Ohm's Law, calculate the resistance as is done with a standard ohmmeter. In the motor operating state, however, where the motor temperature, and hence resistance, varies greatly, such ohmmeter type resistance determinations are not practical.

An example of a motor control system which requires a knowledge of the motor resistance on an instantaneous basis during operation is found in co-pending U.S. patent application Ser. No. 335,344, "Method and Apparatus for Generating Signals Representing Motor Flux in an AC Motor" by B. P. Chausse, et al., filed Dec. 29, 1981, assigned to the assignee of the present invention and which is specifically incorporated hereinto by reference. The invention described therein includes a scheme for determining the extant resistance of an operating ac motor which is entirely adequate for many applications. It has been found, however, that for some applications, particularly when the motor is operated in the regenerative mode, the temperature determination scheme therein described is not as accurate as desired and may, in fact, lead to some instability.

Although not limited thereto, the present invention finds particular application in the flux signal generation scheme of the aforementioned application Ser. No. 335,344 and it is with respect to the basic scheme of that application that the present invention will be described. In this context, and as is explained in that document, in most instances the development of a flux signal does not present a significant problem. Flux sensors can be used, as can additional sensors, for motor torque, etc. In certain situations, however, the use of such additional sensors creates serious expense and problems. As an example, in the normal excavating shovel, the motor(s) which are used to propel the equipment are located adjacent the propelling equipment (e.g., treads) while the basic power supply and control therefor are located in the cab which is pivotable with respect to the propelling equipment. As such, all electrical connections to the motor are normally made through slip rings. Such slip rings not only represent an initial extra expense, but their maintenance, in the extremely hostile environment to which excavating shovel is exposed, is considerable. This maintenance problem is particularly pronounced in the low power level situations which exist with low power feedback signals such as would be derived from flux coils located in the motor.

One well known method of obtaining a signal representative of motor flux, when so-called flux coils are not used, is to integrate the term, motor terminal volts minus the current times resistance (IR) drop of the motor. As earlier mentioned, while the resistance of a particular motor can be readily measured when the motor is not running, it must be remembered that the motor resistance will vary with temperature and, perhaps, with aging of the motor.

The need for an accurate indication of motor resistance, if the integrating method of determining motor flux is to be used, is apparent when it is realized that in most controls when in the motoring mode of operation, if the value used for the resistance is too low, the motor control may limit the load torque to a value less (e.g., to one-half) of that actually permitted. Conversely, if the resistance value used is higher than the actual resistance, not only will the torque be incorrect, but the motor control may rapidly become unstable. The consequences of the latter situation are readily apparent and the difficulties associated with the first becomes so when it is realized, that in many circumstances such as the shovel use earlier indicated, the motor must deliver full rated torque at low speeds. Thus, it is the practice of the industry to attempt to use a resistance value which is slightly below (e.g. 10%) the actual resistance to insure stability while maintaining adequate torque.

In the regenerative mode of motor operation, however, an opposite problem exists. In this mode, the resistance value used cannot be less than the actual resistance without risk of stability problems. Thus, the safe practice is to use a resistance value which is slightly greater than the actual value (e.g. 10% greater.)

SUMMARY OF THE INVENTION

It is, therefore, an object of the present invention to provide improved apparatus and method for developing a signal representative of the stator resistance of an ac motor.

It is a further object to provide a system for developing signals proportional to motor stator resistance through the sensing of motor terminal voltage and motor current.

It is another object to provide a method and apparatus for developing signals representing motor stator resistance corrected for stability margin in either the motoring or regenerative mode of operation.

It is a still further object to provide a method or apparatus for developing signals representing the resistance of the motor stator which requires only the direct sensing of the motor current and motor voltage.

The foregoing other objects are achieved, in accordance with the present invention, by providing, for use in an ac motor control system the sensing of values of terminal voltages and the values of individual phase currents delivered to a polyphase ac motor. From these sensed values, there is developed, in conjunction with a signal representing the motor resistance, a signal representing the motor flux which, in turn, is utilized in the development of the signal representing the motor resistance.

BRIEF DESCRIPTION OF THE DRAWING

While the present invention is defined in particularity in the claims annexed to and forming a part of this specification, a better understanding can be had from the following description taken in conjunction with the accompanying drawing in which:

DETAILED DESCRIPTION

Figure 1:
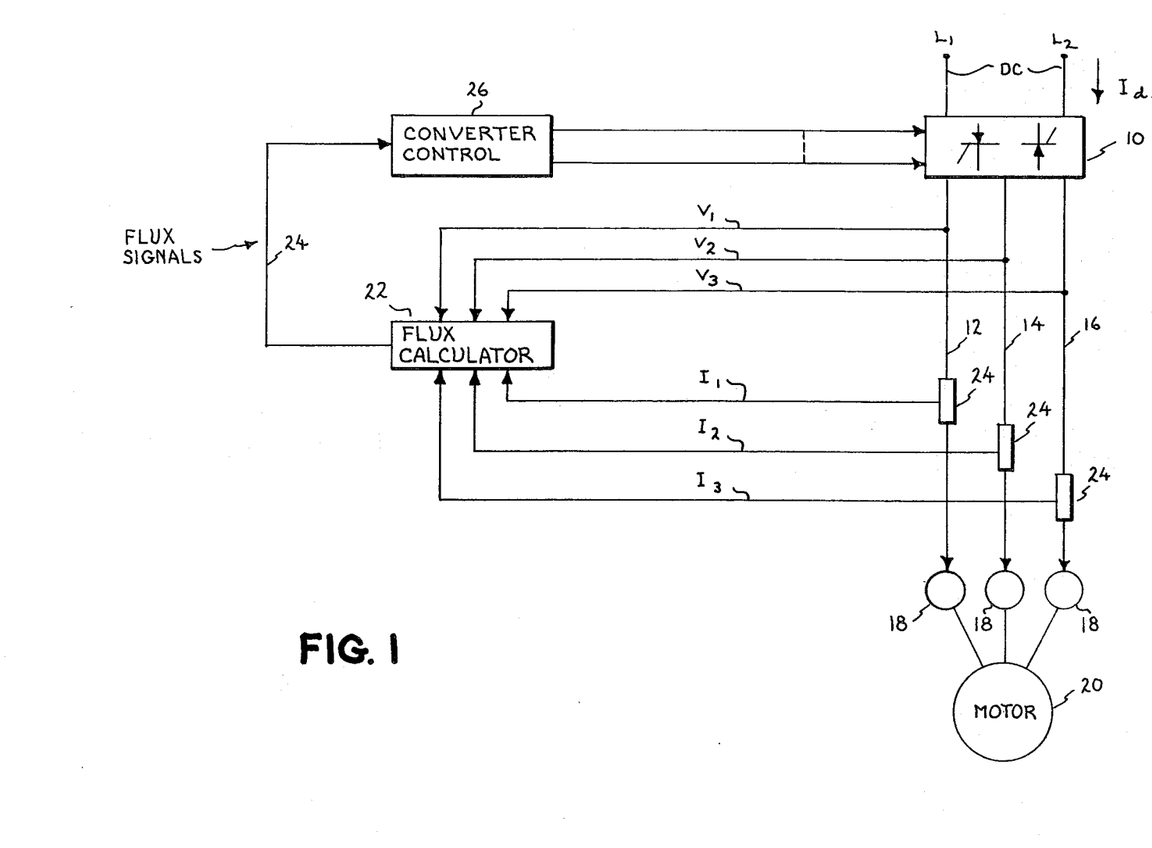
FIG. 1 is a high level block diagram illustrating a basic ac motor control system demonstrating an environment for the present invention; and, FIG. 2 is a schematic diagram illustrating, in analog form, the present invention in its preferred embodiment.

FIG. 1 illustrates in high level block form a typical environment within which the present invention may be utilized. As shown in FIG. 1, a dc source of any suitable type, represented by the terminals $L_1$ and $L_2$, serves to supply a dc current ($I_{dc}$) to a power converter 10. The exact nature of the dc source is not of major importance to the present invention and it may supply either a constant dc current or variable dc current in accordance with the overall system. A battery may, for example, be used to provide a constant dc current. In the case of a variable dc current, the dc source may be, for example, a chopper circuit, supplied from a constant dc potential, operated in time ratio control. More commonly, however, the source would be a phase controlled rectifier bridge connected to an ac source and serving to supply a variable dc current as a function of the control of that rectifier in a manner known in the art. Similarly, the converter 10 details are not pertinent to the present invention but this converter would, most likely in the present state of the art, be a thyristor bridge which is capable of operating in the inversion mode and which serves to provide variable frequency ac power at its output as a function of input control signals. This type converter is customarily referred to as an inverter and is also well known in the art.

The output of the converter 10, shown in FIG. 1 as a three-phase output, is applied by way of lines 12, 14 and 16 to an ac motor stator 20 by way of slip ring power connections 18. The three line voltages on lines 12, 14 and 16 are supplied to a flux calculator 22 and are represented in FIG. 1 as the three voltage signals $V_1$, $V_2$ and $V_3$. The currents in each of the three phase lines 12, 14 and 16 are sensed by suitable current sensors 24 to provide current signals $I_1$, $I_2$ and $I_3$ to the same flux calculator 22. The current sensors 24 are, in the illustrated embodiment, preferably low resistance shunts since one of the anticipated primary applications of this invention requires the motor 20 to be operated at low speeds. It is apparent that in other instances other current sensors such as current transformers could be employed.

The flux calculator 22 includes the scheme of the present invention and will be described in detail with respect to FIG. 2. Suffice it to say at the present time that the calculator supplies on its output 24 the flux signal(s) which are required for the operation of a suitable converter control 26. The exact nature of the converter control 26 is not critical to the present invention and would, of course, be determined by the nature of the converter 10. As an example, however, if converter 10 is a controlled current inverter, control 26 could be that which is described in the U.S. Pat. No. 4,230,979, "Control Current Inverter and Motor Control System" by P. M. Espelage et al., issued Oct. 28, 1980, and assigned to the assignee of the present invention, which patent is specifically incorporated hereinto by reference.

Figure 2:
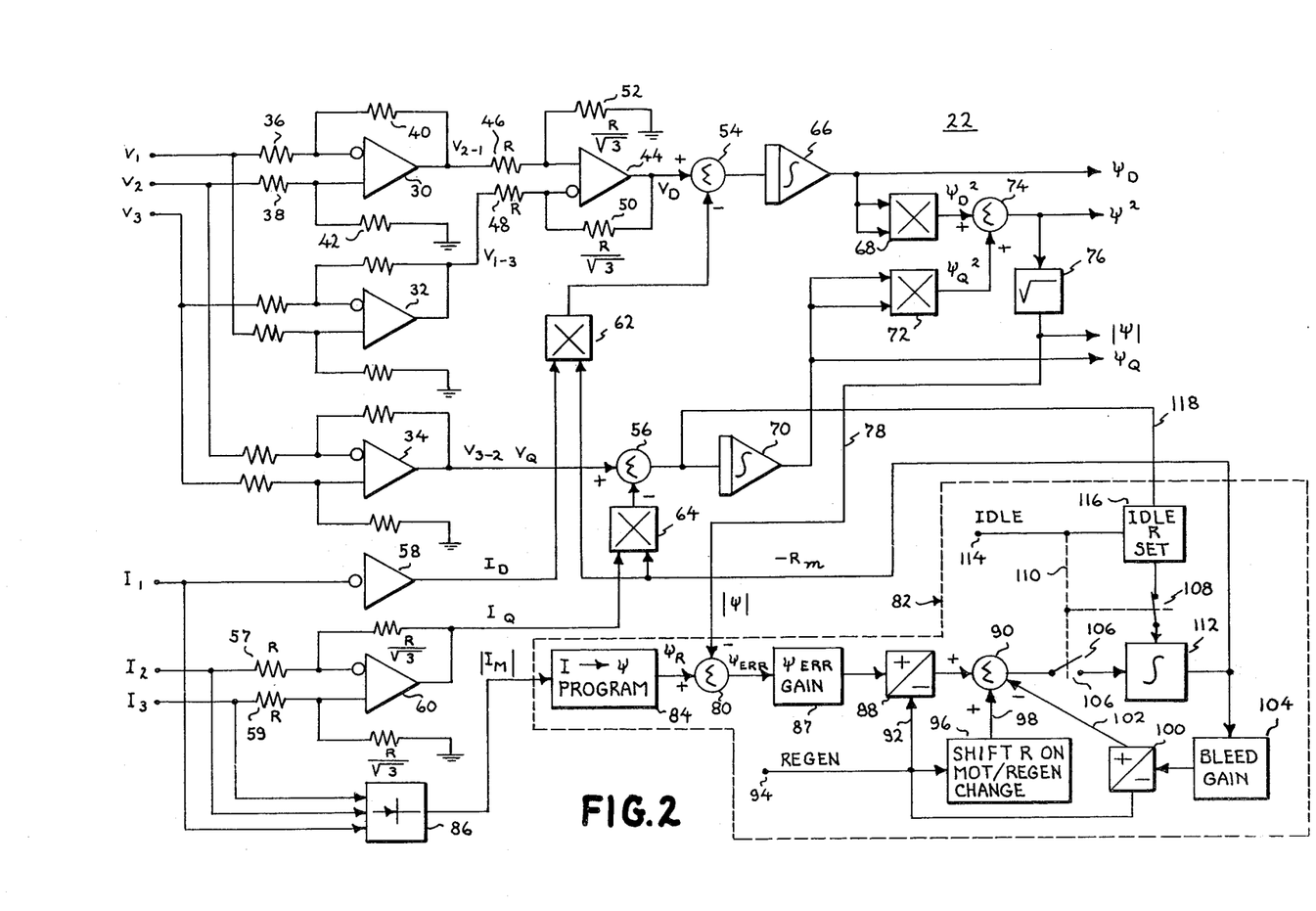

Flux calculator 22, which incorporates the present invention, is illustrated in detail in FIG. 2. Although the FIG. 2 depiction is in analog form, it will be readily apparent to those skilled in the art that a digital implementation employing suitable microprocessors (or other data processing units) could be employed to achieve the desired results with equal facility. In fact, as will be discussed later in this specification, the major portion of the present invention in its preferred embodiment is implemented in a programmed microprocessor. For ease of understanding, however, the analog version of the present invention will first be described.

Referencing now FIG. 2, the three voltage signals $V_1$, $V_2$ and $V_3$ serve as inputs to three operational amplifiers 30, 32 and 34 which are each connected in the subtracting mode. The $V_1$ signal is applied via a suitable input resistor 36 to the inverting input of operational amplifier 30. The $V_2$ signal is applied via input resistor 38 to the non-inverting input of that operational amplifier which input is further tied to ground by way of a resistor 42. A feedback resistor 40 is connected between the output of operational amplifier 30 and its inverting input such that its output is the difference between its two input signals; i.e., the signal $V_{2-1}$. Typically, in this kind of arrangement, the resistors 36 and 38 would be of the same value and resistors 40 and 42 would also be of equal value but of approximately one-hundreth the value of the resistors 36 and 38. Operational amplifiers 32 and 34 have similar associated circuitry and a detailed explanation here is believed unnecessary. Briefly, however, the $V_3$ signal forms the input to the inverting input of operational amplifier 32 and the $V_1$ signal forms the input to the non-inverting input such that the output of amplifier 32 is the difference between $V_1$ and $V_3$ ($V_{1-3}$). In a similar manner, the $V_2$ signal forms an input to the inverting input of operational amplifier 34 and the $V_3$ signal is applied to its non-inverting input such that its output is a signal $V_{3-2}$. The output of operational amplifier 34 is representative of the quadrature component of the motor voltage and is also indicated as $V_Q$.

The $V_{2-1}$ signal from operational amplifier 30 is applied by way of a suitable input resistor 46 to the non-inverting input of an operational amplifier 44, which non-inverting input is also tied to ground by way of a resistor 52. The output of operational amplifier 32 ($V_{1-3}$) is applied by way of a resistor 48 to the inverting input of the amplifier 44 and there is further included a feedback resistor 50 which connects the output of that operational amplifier to its inverting input. In this situation resistors 46 and 48 would be, preferably, of equal value, represented by R, and resistors 50 and 52 would have a proportional value represented by $R/\sqrt{3}$. The output of operational amplifier 44 is a signal designated $V_D$ which represents the direct component of the motor voltage. The $V_D$ signal is supplied in a positive sense to a suitable summing junction 54 while the $V_Q$ signal from operational amplifier 34 supplied, in a positive sense, to a summing junction 56.

The $I_1$ signal is supplied to the inverting input of an operational amplifier 58 connected in the inverting mode such that its output is a signal $I_D$ representing the direct component of motor current. The $I_2$ signal is supplied to the inverting input of an operational amplifier 60 by way of a suitable resistor 57 while the $I_3$ signal is supplied via resistor 59 to the non-inverting input of that operational amplifier. Operational amplifier 57 is connected in the same manner as is operational amplifier 44 with respect to its associated circuit components. The output of operational amplifier 60 is a signal representing the quadrature component of the motor current, $I_Q$.

The $I_D$ signal from amplifier 58 forms one input to a suitable multiplier 62, a second input being a signal designated $-R_M$ which is representative of the motor stator resistance, the generation of which, in accordance with the present invention, will be later discussed. In a similar manner, the $I_Q$ signal is supplied as one input to a multiplier 64 having as its second input the $-R_M$ signal.

The output of multiplier 62 represents the product of the direct component of motor current and the motor stator resistance and is applied, in negative sense, to summing junction 54. The output of that summing junction is furnished to a suitable integrating circuit 66 such that the output of circuit 66 represents the motor flux attributable to the arbitrarily assigned direct axis of the motor. This signal, designated $\psi_D$, serves as one usable output of the flux calculator 22. The output of integrator 66 is also applied as both inputs to a multiplier 68 such that the output of that multiplier is the square of the $\psi_D$ signal, $\psi_D^2$.

In a manner similar to that just described, the output of multiplier 64 is applied in the negative sense to summing junction 56, the other input of which is the $V_Q$ signal. The output of summing junction 56 is applied to an integrator 70 such that its output is representative of the arbitrarily assigned quadrature axis of flux, $\psi_Q$. The $\psi_Q$ output is applied to the two inputs of a multiplier 72 which provides as its output the square of the quadrature flux signal, $(\psi_Q^2)$. The outputs of the two multipliers 68 and 72 are each furnished in the positive sense to a summing junction 74 which, therefore, provides an output proportional to the square of the motor flux, $\psi^2$. The $\psi^2$ signal is applied to a suitable function block 76 which provides a square root function such that its output is equal to the absolute magnitude of motor flux, that is, $|\psi|$.

The $|\psi|$ signal (representing calculated motor flux) is applied, via line 78, as one input to a summing junction 80 which is included within the dashed line block 82 within which are included the functional elements of the motor resistance development scheme of the present invention. As indicated, the $|\psi|$ signal is applied to junction 80 in a negative sense and a second signal, $\psi_R$, is applied to that junction in a positive sense from block 84. Block 84, designated "I→$\psi$ Program" provides the function of developing a signal which is proportional to the anticipated motor flux which will result from the motor current. To this end there is provided to block 84 a signal $|I_M|$ representing the absolute magnitude of the motor current. This $|I_M|$ signal may be derived in any convenient manner but typically is derived through the use of a full wave rectifier 86 which receives the three current signals $I_1$, $I_2$ and $I_3$ as inputs.

In analog form, block 84 could be comprised of a linear or non-linear analog amplifier having a gain equal to the expected relationship between motor flux and motor stator current.

The result of combining the $\psi_R$ and $|\psi|$ signals in junction 80 is a flux error signal, $\psi_{ERR}$, which, after being suitably scaled in a gain block 87, serves as one input to a polarity determination block 88. Block 88 preferably has unity gain and serves to provide either a positive or negative signal to summing junction 90 as a function of a second input signal applied thereto via line 92.

The signal on line 92 designates whether the motor is in the motoring or regenerating mode of operation and, in accordance with the embodiment of the invention being discussed, causes block 88 to provide a positive output signal when the motor is in the motoring mode and a negative output signal when in the regenerative mode. The signal on line 92 is derived from what is illustrated as a terminal 94 to which is applied a level signal indicating the mode of operation of the motor and is derived as a function of the command angle of firing of the thyristors of the converter 10 (FIG. 1) and the direction of the motor rotation all in accordance with that which is well known in the art.

The regeneration signal at terminal 94 is also applied to a block 96 designated SHIFT R ON MOTOR/REGENERATION CHANGE. This block provides an output via line 98 to the summing junction 90 which upon change of the level of the signal at terminal 94 causes a block change or jump signal (i.e., a step shift) to be applied to summing junction 90. As was earlier described, when the motor is operating in the motoring mode it is desired to use a resistance value less than the actual value of resistance. When the motor is in the regenerative mode it is desirable to use a resistance value which is higher than actual. The function of block 96, therefore, is to provide a shift change which normally is about twenty percent of the nominal resistive value of the motor stator such that, for example, if the motor is in the regenerative mode and the actual resistance value were ten percent higher than nominal the new value according to the step shift would be approximately ten percent less than the nominal value.

The signal at terminal 94 is also applied to a second polarity determination of block 100. The output of this block is applied, via line 102, as the third input to summing junction 90. The block 100 determines the polarity of an input signal from a "Bleed Gain" block 104, to be discussed later, and provides a positive signal when the motor is in the regenerative operation mode and a negative signal when it is in the motoring mode.

To complete the depiction of that portion of FIG. 2 within dashed line block 82, there is shown an additional terminal 114 to which is applied an "IDLE" signal. "Idle" as used in this specification is defined as a condition of zero motor speed with a dc current component being supplied to the motor stator. This signal will be of a first value when the motor is in the idle condition and of a second value when the motor is in a running state. This is a function of the program control in the software embodiment and may be derived from the overall control function of the system in the hardware or analog embodiment. As illustrated by the dashed line 110, the IDLE signal affects two switches 106 and 108 which are ganged so that they are mutually of opposite condition. That is, when switch 106 is closed, switch 108 is open and, conversely, when 106 is open, 108 is closed. Although the switches 106 and 108 have been indicated as mechanical switches, it is obvious that these would normally be electronic type switches in accordance with today's good engineering practices. Assuming the motor is in the idle condition, switch 108 will be closed and will supply a signal from an "IDLE R SET" function block 116 to an integrator 112. Block 116 receives as its input signal the output of summing junction 56, a nulling signal, by way of line 118. Block 116 performs, essentially, an ohmmeter function and with switch 108 closed will supply a signal to the integrator 112 to set the output of that integrator to an ambient or idle resistance. Integrator 112 provides the $-R_M$ signal to the two multipliers 62 and 64.

Earlier mention was made of the Bleed Gain 104. It is seen in FIG. 2 that this block is also connected to the output of integrator 112. The function of Bleed Gain 104, a gain amplifier of preset magnitude, is to maintain the error in the stator resistance signal as applied to the integrator 112 below the actual value of motor stator resistance in motoring operation and above the actual stator resistance in the regenerative mode.

Thus, it is seen that it has been provided an accurate stator resistance computation scheme for an operating motor which accounts for both the motoring and regenerative modes of operation. This scheme, as was previously indicated, is primarily found within the block 82 and it will be recognized by those familiar with the aforementioned patent application Ser. No. 335,344 that with the exception of the material within block 82 and the associated inputs thereto, the above description is substantially identical therewith.

As earlier noted, the stator resistance computation of the present invention is preferably performed in a data processing unit which is suitably programmed as opposed to the analog form shown, although the analog form shown is believed to best enable an understanding of the invention. In this regard, the elements within block 82, with the exception of the IDLE R SET block 116, are functionally performed using a microprocessor such as an Intel 8086 microprocessor which is programmed in PLM86 language. Attached hereto as Appendix A (seven pages), which Appendix A forms a part of this specification, is a software listing of the program for performing those functions. Operating modes of the motor may extend into ranges where the stator terminal voltages due to stator resistance become a very small component of total stator terminal voltage. In cases such as these, it is possible, as shown in the attached Appendix A, to discontinue the resistance calculation previously described until such time as the stator terminal voltage, due to resistance, again becomes a substantial percentage (e.g., fifty percent) of stator terminal volts. Typically, the resistance calculations would cease to be used at motor speeds in excess of fifteen to twenty percent of rated motor speed. In a like manner, the resistance calculation may be discontinued when the motor stator current is below the level where stator terminal voltage due to resistance is significant; e.g., current levels below fifteen percent of rated current.

While there have been shown and described what are at present considered to be the preferred embodiments of the present invention, modifications thereto will readily occur to those skilled in the art. For example, although a three-phase system has been illustrated, the present invention has equal applicability to any polyphase system. It is not desired, therefore, that the invention be limited to the specific arrangement shown and described and it is intended to cover in the appended claims all such modifications as fall within the true spirit and scope of the invention.

We claim:

1. A system for deriving a signal proportional to the stator resistance of an alternating current motor, capable of operating in motoring and regenerative modes, provided with electrical power from a polyphase alternating current power source comprising:

(a) means to develop voltage signals and current signals representing, respectively, the voltage and current supplied to said motor from said source;
  (b) means response to said voltage signals, said current signals and said signal proportional to the stator resistance of said motor to develop a calculated flux signal representing the magnitude of the actual flux developed by the motor;
  (c) means responsive to said current signals to develop a signal representing the anticipated motor flux resulting from said current;
  (d) means to combine said calculated flux signal and said anticipated flux signal to provide a flux error signal;
  (e) means to determine the polarity of said flux error signal, as a function of whether said motor is in the motoring or regenerative mode of operation, to provide an adjusted flux error signal; and,
  (f) means to integrate said adjusted flux error signal to thereby develop said signal proportional to the stator resistance of said alternating current motor.

2. The invention in accordance with claim 1 further including means to provide a step shift in the value of said stator resistance signal in response to an indication that the motor has changed its mode of operation between the motoring and regenerative modes.

3. The invention in accordance with claim 2 wherein said last recited means provides a prescribed value shift to the adjusted flux error signal of a first polarity when the motor changes from the motoring to the regenerative and a prescribed value shift of the opposite polarity when the motor changes from the regenerative to the motoring mode.

4. The invention in accordance with claim 1 further including means to maintain the signal proportional to the motor stator resistance at a value below the actual resistance value when the motor is in the motoring mode of operation and at a value above the actual motor stator resistance when the motor is in the regenerative mode of operation.

5. The invention in accordance with claim 4 wherein said means to maintain the signal proportional to the stator resistance acts to vary the value of said adjusted flux error signal.

6. The invention in accordance with claim 5 wherein said means to maintain the signal proportional to the stator resistance includes means to vary the value of said adjusted flux error signal in a first direction when the motor is operating in the motoring mode and in a second direction when said motor is operating in the regenerative mode.

7. The invention in accordance with claim 2 further including means to maintain the signal proportional to the motor stator resistance at a value below the actual resistance value when the motor is in the motoring mode of operation and at a value above the actual motor stator resistance when the motor is in the regenerative mode of operation.

8. The invention in accordance with claim 3 further including means to maintain the signal proportional to the motor stator resistance at a value below the actual resistance value when the motor is in the motoring mode of operation and at a value above the actual motor stator resistance when the motor is in the regenerative mode of operation.

9. The invention in accordance with claim 7 wherein said last recited means acts to vary the value of said adjusted flux error signal.

10. The invention in accordance with claim 8 wherein said last recited means acts to vary the value of said adjusted flux error signal.

11. The invention in accordance with claim 1 further including means to establish an initial value of motor stator resistance for a motor operation in an idle mode as a function of motor voltage and motor current at idle.

12. A method for deriving a signal representative of the stator resistance of an alternating current motor which is capable of operating in motoring and regenerating modes and which is provided with electrical power from polyphase alternating current source comprising the steps:
   (a) developing a current signal representing the current supplied to said motor from the source;
   (b) developing a calculated flux signal representing the magnitude of the actual flux developed by the motor;
   (c) developing, in response to said current signal, an anticipated flux signal representing the anticipated motor flux resulting from said current;
   (e) combining said calculated flux signal and said anticipated flux signal to provide a flux error signal;
   (f) determining the polarity of said flux error signal to provide an adjusted flux error signal as the function of the operating state, motoring or regenerative, of the motor; and,
   (g) integrating said adjusted flux error signal to thereby develop said signal representative of the stator resistance of said alternating current motor.

13. The method in accordance with claim 12 further including the step of providing a step shift in the value of said stator resistance signal in response to an indication that the motor has changed its mode of operation between the motoring and the regenerative modes.

14. The method in accordance with claim 13 wherein the step of providing the step shift to the adjusted flux error signal is of a first polarity when the motor changes from motoring to regenerative and of the opposite polarity when the motor changes from the regenerative mode to the motoring mode.

15. The method in accordance with claim 12 further including the step of maintaining the signal proportional to the stator resistance at a value below the actual resistance value of the stator when the motor is in the motoring mode of operation and at a value above the actual stator resistance value when the motor is in the regenerative mode of operation.

16. The method in accordance with claim 13 further including the step of maintaining the signal proportional to the stator resistance at a value below the actual stator resistance value of the motor when the motor is in the motoring mode of operation and at a value above the actual stator resistance value when the motor is in the regenerative mode of operation.

17. The method in accordance with claim 14 further including the step of maintaining the signal proportional to the motor resistance at a value below the actual resistance value of the stator when the motor is in the motoring mode of operation and at a value above the actual stator resistance value when the motor is in the regenerative mode of operation.

18. The method in accordance with claim 15 further including wherein the last recited step includes the varying of the value of said adjusted flux error signal in a first direction when the motor is operating in the motoring mode and in a second direction when said motor is operating in the regenerative mode.

19. A method for deriving a signal representative of the stator resistance of an alternating current motor which is supplied with electrical power from an alternating current source and which is capable of operating in motoring and regenerative modes comprising the steps:
   (a) developing voltage signals proportional to the voltage applied to the motor;
   (b) developing current signals proportional to the current supplied to the motor;
   (c) developing a calculated flux signal representing the actual motor flux developed by the motor as a function of said voltage signals, said current signals and said signal representative of the motor resistance;
   (d) developing, in response to said current signals, an anticipated flux signal representing the anticipated motor flux resulting from the motor current;
   (e) combining said calculated flux signal and said anticipated flux signal to provide a flux error signal;
   (f) determining the polarity of said flux error signal as a function of the motor operating mode, motoring or regenerative, to provide an adjusted flux error signal; and,
   (g) integrating said adjusted flux error signal to thereby develop said signal representative of the resistance of said motor stator.

20. The method in accordance with claim 19 further including the step of providing a step shift in the value of said stator resistance signal in response to an indication that the motor has changed its mode of operation between the motoring and the regenerative modes.

21. The method in accordance with claim 20 wherein the step of providing the step shift to the stator resistance signal is of a first polarity when the motor changes from motoring to regenerative and of the opposite polarity when the motor changes from the regenerative mode to the motoring mode.

22. The method in accordance with claim 19 further including the step of maintaining the signal proportional to the motor stator resistance at a value below the actual stator resistance value of the motor when the motor is in the motoring mode of operation and at a value above the actual stator resistance value when the motor is in the regenerative mode of operation.

23. The method in accordance with claim 20 further including the step of maintaining the signal proportional to the motor stator resistance at a value below the actual stator resistance value of the motor when the motor is in the motoring mode of operation and at a value above the actual stator resistance value when the motor is in the regenerative mode of operation.

24. The method in accordance with claim 21 further including the step of maintaining the signal proportional to the motor stator resistance at a value below the actual stator resistance value of the motor when the motor is in the motoring mode of operation and at a value above the actual stator resistance value when the motor is in the regenerative mode of operation.

* * * * *

UNITED STATES PATENT AND TRADEMARK OFFICE
CERTIFICATE OF CORRECTION

PATENT NO. : 4,451,770
DATED      : May 29, 1984
INVENTOR(S): Fred H. Boettner, John H. Cutler and Loren H. Walker It is certified that error appears in the above-identified patent and that said Letters Patent are hereby corrected as shown below:

Column 1, line 30, delete "co-pending".
Column 1, line 31, delete "application Ser. No. 335,344" and substitute --4,431,957--.
Column 1, lines 33 and 34, delete "filed Dec. 29, 1981" and substitute --issued February 14, 1984--.
Column 1, lines 46 and 47, delete "application Ser. No. 335,344" and substitute --Patent 4,431,957--.
Column 1, line 64, after "which" insert --an--.
Column 7, line 12, delete "patent application Ser. No. 335,344" and substitute --Patent 4,431,957--.

Column 7, line 43, after "current." insert -- This feature is also shown in the attached Appendix A. --.

Signed and Sealed this

Twenty-ninth Day of January 1985

[SEAL]

Attest:

DONALD J. QUIGG

Attesting Officer    Acting Commissioner of Patents and Trademarks

```
PL/M-86 COMPILER    BE295B  AC EXCAVATOR CODE FOR BE MINING SHOV  05/09/83 14:44:49 PAGE  1
                    BERESI  RESISTANCE CALCULATOR FOR PROPEL OPERATION

VAX/VMS PL/M-86 V1.0 COMPILATION OF MODULE BERESI
OBJECT MODULE PLACED IN RESI.OBJ
COMPILER INVOKED BY:  PLM86 RESI.OLD COMPACT OPTIMIZE(3) ROM DEBUG PAGEWIDTH(93)
                      PAGELENGTH(55)

$TITLE('BE295B  AC EXCAVATOR CODE FOR BE MINING SHOVELS')
            $SUBTITLE('BERESI  RESISTANCE CALCULATOR FOR PROPEL OPERATION')
            /*----------------------------------------------------------------
            ...NAME:  BERESI0000
            .
            ...AUTHOR:  BOETTNER
            .
            ...COPYRIGHT:  ALL RIGHTS RESERVED.  NO PART OF THIS PROGRAM OR
            .              PUBLICATION MAY BE REPRODUCED, TRANSMITTED,
            .              TRANSCRIBED, STORED IN A RETRIEVAL SYSTEM, OR
            .              TRANSLATED INTO ANY LANGUAGE, IN ANY FORM OR BY ANY
            .              MEANS, ELECTRONIC, MECHANICAL, MAGNETIC, OPTICAL,
            .              CHEMICAL, MANUAL OR OTHERWISE, WITHOUT THE PRIOR
            .              WRITTEN PERMISSION OF THE GENERAL ELECTRIC COMPANY,
            .              1501 ROANOKE BLVD., SALEM, VIRGINIA, 24153.
            .
            ...KEYWORDS: PLM86, AC_EXCAVATOR, CONTROL,
            .
            ...ABSTRACT:
            ......DESCRIPTION: RESISTANCE DETERMINATION FOR PROPEL MOTOR STATOR. USED
            .                  ONLY IN PROPEL WHERE FLUX FEEDBACK IS UNAVAILABLE.
            .
            ...BUILD_INSTRUCTIONS:
            ......PROCESSOR:  PLM86R1
            ......PROCESSOR_CONTROLS:  COMPACT OPTIMIZE(3) ROM PAGEWIDTH(130) DEBUG
            .
            ......INPUTS: RAISE, LOWER BITS IN IDLE. CURRENT, SPEED, AND ANGLE.
            ----------------------------------------------------------------*/

/*+*************************************************************/
            /*                                                              */
            /*     FILE NAME: BERESI.SRC                                    */
            /*                                                              */
            /*     CONSTANTS: NAME      SCALE       RANGE    NAME     SCALE       RANGE  */
            /*                                                              */
            /*               IMIN      5V=1024              ICOMMSL  256                 */
            /*               RSCALE    1           0 TO 64  RCTIME   SEC*204.8           */
            /*               RLAG      SEC*8192             RGAIN    *16                 */
            /*               RINC      1           1 TO 5   RMAXN    1V=204.7            */
            /*               FLXHINT   1V=204.7             FLXLINT  1V=204.7            */
            /*               FLS$HSL   *128                 FLX$LSL  *128                */
            /*               FLX$CP2   1V=204.7             RSLOW    SEC*8192            */
            /*               RFLXGM    128=1                RFLXGR   128=1               */
```

```
                    /*              ANGPRGCOR 1V=204.7                         */
                    /*                                                         */
                    /*    OUTPUT: ANALOG - RCOMP  DIGITAL - B0RCOMPOK          */
                    /*    REFERENCE: BE295, M-30                               */
                    /*                                                         */
                    /***********************************************************/
                    /*                                                         */
                    /*    REVISION:  NUMBER : 1.1                              */
                    /*                                                         */
                    /*               DATE   : 12/5/80                          */
                    /*                                                         */
                    /*               AUTHOR : F. BOETTNER                      */
                    /*                                                         */
                    /*          CHANGE SUMMARY : 12/5/80  F. BOETTNER          */
                    /*                            1/8/81  F. BOETTNER          */
                    /*                            3/6/81  F. BOETTNER          */
                    /*                            5/5/81  F. BOETTNER  SLOWDOWN*/
                    /*                            6/2/81  F. BOETTNER  RMINNR  */
                    /***********************************************************/

1          BERESI: DO ;

/***********************************************************/
                    /*                  LOCAL   DECLARATIONS                   */
                    /***********************************************************/

2    1     DECLARE    RERR$GM      BYTE ;    /* ERROR GAIN FOR MOTORING      */
 3    1     DECLARE    RERR$GR      BYTE ;    /* ERROR GAIN FOR REGEN         */
 4    1     DECLARE    RERRG        BYTE ;    /* ERROR GAIN SELECTED FROM ABOVE */
 5    1     DECLARE    RBLEED       BYTE ;    /* RBLEED GAIN SELECTED FROM ABOVE */
 6    1     DECLARE    RCOMP$WRD    WORD AT(@RCOMP$INT) ;
 7    1     DECLARE    RTCOM$WRD    WORD ;
 8    1     DECLARE    RFLX$WRD     WORD ;    /* FLUX COMMAND DERIVED FROM RTCOM */
 9    1     DECLARE    RFERR$WRD    WORD ;    /* DIFFERENCE BETWEEN RFLX AND FLUX*/
10    1     DECLARE    RFERR$INT    INTEGER AT(@RFERR$WRD) ;
11    1     DECLARE    RIDLE        WORD ;    /* IDLE VALUE OF RCOMP WHEN OK  */
12    1     DECLARE    TCOMLIM$WRD  WORD AT(@TCOMLIM$INT) ;
13    1     DECLARE    TCOMM$WRD    WORD AT(@TCOMM$INT) ;
14    1     DECLARE    IMAVG$WRD    WORD AT(@IMAVG$INT) ;
15    1     DECLARE    TMP$WRD1     WORD ;    /* USED TO STORE ERR * GAIN     */
16    1     DECLARE    TMP$INT1     INTEGER AT(@TMP$WRD1) ;
17    1     DECLARE    TMP$WRD2     WORD ;    /* USED TO STORE RCOMP * BLEED  */
18    1     DECLARE    TMP$INT2     INTEGER AT(@TMP$WRD2) ;
19    1     DECLARE    (REMAINDER1,REMAINDER2,REMAINDER3,REMAINDER4)  WORD ;
20    1     DECLARE    REGEN        BYTE ;    /* SET TO FFH WHEN IN REGEN     */
21    1     DECLARE    OLD$REGEN    BYTE ;    /* LAST SWEEP VALUE OF REGEN BYTE */
22    1     DECLARE    (TIMER,COUNT,INTERVAL,SIGN,I) BYTE ;
23    1     DECLARE    ICOMMSL      WORD EXTERNAL ; /* FROM BEANGL */
24    1     DECLARE    FLXCP2       WORD EXTERNAL ; /* FROM BEFCIA */
25    1     DECLARE    SLOW$COUNT   WORD ;
```

```
PL/M-86 COMPILER    BE295B AC EXCAVATOR CODE FOR BE MINING SHOV  05/09/83 14:44:49  PAGE
                    BERESI  RESISTANCE CALCULATOR FOR PROPEL OPERATION $EJECT
              /*********************************************************************
              /*      PUBLIC AND EXTERNAL DECLARATIONS                              */
              /*********************************************************************
26   1        DECLARE (B0RCOMPOK,B1NONDAC2,RCMP07,RFLXGM,RFLXGR,RGAINM,RGAINR,RINC,
                       RLAGM,RLAGR,RSCALE,STATUS2,STATUS4,SWEEPTIME) BYTE EXTERNAL ;
27   1        DECLARE (FLXHINT,FLXHSL,FLXLINT,FLXLSL,IMIN,RCTIME,RMAXN,RMINNR,RSLOW,
                       SPEEDWRD) WORD EXTERNAL ;
28   1        DECLARE (FLUXINT,IMAVGINT,RCOMPINT,SPEEDINT,TCOMLIMNINT,TCOMLIMPINT,
                       TCOMMINT) INTEGER EXTERNAL ;

/*********************************************************************
              /*      LITERAL DECLARATIONS                                          */
              /*********************************************************************
29   1        DECLARE SET          LITERALLY '0FFH' ;
30   1        DECLARE RESET        LITERALLY '00H'  ;
31   1        DECLARE NEGSIGN      LITERALLY '8000H' ;
32   1        DECLARE B0IDLEC$M2   LITERALLY '02H' ;
33   1        DECLARE B1RAISE$M4   LITERALLY '01H' ;
34   1        DECLARE B1LOWER$M4   LITERALLY '02H' ;

/*********************************************************************
35   1           RESI$INIT: PROCEDURE PUBLIC ;
              /*********************************************************************
36   2           COUNT, TIMER, REGEN = RESET ;
37   2           REMAINDER1, REMAINDER2, REMAINDER3, REMAINDER4 = 0 ;
38   2           B0$RCOMP$OK = SET ;
39   2           RCOMP$WRD   = 896 ;              /* START VALUE 4.38V.  SCALE 5V = 1024 */
40   2           RCMP$0$7    = HIGH(LOW(RCOMP$WRD)*RSCALE)+HIGH(RCOMP$WRD)*RSCALE ;
              /* RCMP$0$7 = (RCOMP * RSCALE)/ 256    */
                                                  /* RGAIN SCALE = 16                    */
41   2           RERR$GM     = SHR((RGAINM * SWEEP$TIME),4) ;
              /* RERRG     = (RGAIN * SWEEP$TIME)/16 */
42   2           RERR$GR     = SHR((RGAINR * SWEEP$TIME),4) ;
43   2           INTERVAL    = RCTIME / SWEEP$TIME ;
44   2           SLOW$COUNT  = RSLOW / SWEEP$TIME ;
45   2        END RESI$INIT ;
```

```
                SEJECT
                /************************************************************
46    1         RESISTANCE$CALC:   PROCEDURE PUBLIC ;
                /************************************************************

47    2            IF B1NONDAC2 = 0 THEN OUTPUT(40EH) = 60H ;
49    2            IF NOT ( ( STATUS2 AND B0$IDLEC$M2 ) = B0$IDLEC$M2 )
                      THEN DO; /********************************************/
                               /**      IDLE RCOMP ACTIVE                 **/
                               /********************************************/
51    3                  COUNT = COUNT + 1 ;
52    3                  IF COUNT = INTERVAL            /* RUN ONCE EVERY INTERVAL SWEEPS */
                            THEN DO ;
54    4                        COUNT, I = RESET ;
55    4                        IF (STATUS4 AND B1$RAISE$M4) = B1$RAISE$M4 THEN I = I + 1 ;
57    4                        IF (STATUS4 AND B1$LOWER$M4) = B1$LOWER$M4 THEN I = I + 2 ;
59    4                        DO CASE I ;
60    5                           TIMER = TIMER + 1 ;   /* BOTH BITS LOW, RCOMP OK       */
61    5                           DO ;                  /* RAISE BIT ON, RAISE RCOMP     */
62    6                              RCOMP$WRD = RCOMP$WRD + DOUBLE(RINC);
63    6                              TIMER = RESET ;
64    6                              END ;
65    5                           DO ;                  /* LOWER BIT ON, LOWER RCOMP     */
66    6                              RCOMP$WRD = RCOMP$WRD - DOUBLE(RINC) ;
67    6                              TIMER = RESET ;
68    6                              END ;
69    5                           TIMER = RESET ;       /* BOTH BITS HIGH, RESET TIMER   */
70    5                           END ;

71    4                        IF TIMER > 2
                                  THEN DO ;             /* RCOMP IS OK ON 3 SWEEPS       */
73    5                              TIMER = 3 ;        /* PROTECT TIMER FROM OVERFLOW   */
74    5                              B0$RCOMP$OK = RESET ;
75    5                              END ;
76    4                           ELSE B0$RCOMP$OK = SET ;
                        /* RCOMP NOT OK CONSECUTIVE TIMES */
77    4                        RIDLE = RCOMP$WRD ;      /* CLAMPS NOT ACTIVE IN IDLE MODE */
78    4                        END ;
79    3                     ELSE ;                      /* WAIT BETWEEN COUNT INTERVALS  */
80    3                  END ;

81    2               ELSE DO ; /*******************************************
                              /*      NOT IN IDLE, RUN DYNAMIC RCOMP       */
                              /*******************************************
82    3                  IF COUNT <> (INTERVAL+1)
                            THEN RCOMP$WRD = RCOMP$WRD - SHR(RCOMP$WRD,5) ;
                        /* UNDERCOMPENSATE EXITING IDLE   */
84    3                  COUNT = INTERVAL + 1 ;          /* GIVES IDLE ENTRY DELAY       */
85    3                  I = I + 1 ;                     /* USE I AS COUNTER IN DYNAMIC  */
86    3                  IF I = SLOW$COUNT
```

```
                                    THEN DO ;                        /* RUN CODE ONLY IF I = COUNT      */
 88      4                             I = 0 ;
 89      4                             IF (IABS(SPEED$INT) < INT(RMAXN))
       -         /* IS SPEED LOW?               */
                                       AND ((TCOMM$INT > (TCOMLIMP$INT-INT(SHR(TCOMLIMP$WRD,3))))
       -         /* IS TCOMM HIGH?              */
                                       OR (TCOMM$INT < (TCOMLIMN$INT-SAR(TCOMLIMN$INT,3))))
                                       AND (NOT((REGEN = SET) AND (IABS(SPEED$INT) < INT(RMINNR))))
       -         /* IF REGEN, IS SPEED > RMINNR ? */
                                    THEN DO ;                        /* IF ABOVE OK THEN RUN CODE       */
 91      5                             OLD$REGEN = REGEN ;
 92      5                             IF ( SPEED$WRD AND NEG$SIGN ) = ( TCOMM$WRD AND NEG$SIGN
       -         )
                                    THEN DO ;            /* DRIVE IS MOTORING                */
 94      6                             REGEN = RESET ;
 95      6                             RBLEED = RLAGM ; /* USE MOTORING LAG FOR RBLEED */
 96      6                             RERRG  = RERR$GM; /* USE MOTORING GAIN FOR RERR  */
 97      6                             END ;
 98      5                          ELSE DO ;            /* DRIVE IS REGEN                   */
 99      6                             REGEN = SET ;
100      6                             RBLEED = RLAGR ;
101      6                             RERRG  = RERR$GR ;
102      6                             END ;
       /*************** CALCULATE RFLUX COMMAND FROM MOTOR CURRENT ***************/

103      5                             IF IMAVG$WRD < IMIN THEN IMAVG$WRD = IMIN ;
       -         /* PROTECT AGAINST LOW IM       */
                                                                     /* FIND RTCOM FROM CURRENT         */
105      5                             RTCOM$WRD = SHL((IMAVG$WRD - IMIN),8) / ICOMMSL +
       -         /* RTCOM = (((IMAVG-IMIN)*256)/ICOMMSL) */
                                       SHL((SHL(DOUBLE(HIGH(IMAVG$WRD - IMIN)),12)/ICOMMSL),4);
106      5                             IF RTCOM$WRD < FLXCP2
       -         /* FIND RFLUX COMMAND FROM RTCOM */
                                       THEN RFLX$WRD = SHR(LOW (RTCOM$WRD) * FLXL$SL ,7) +
       -         /* RFLX = RTCOM*SLOPE + INTERCEPT */
                                            SHL(HIGH(RTCOM$WRD) * FLXL$SL ,1) + FLXL$INT ;
108      5                             ELSE RFLX$WRD = SHR(LOW (RTCOM$WRD) * FLXH$SL ,7) +
                                            SHL(HIGH(RTCOM$WRD) * FLXH$SL ,1) + FLXH$INT ;
109      5                             IF REGEN = SET
                                       THEN RFLX$WRD = SHR((SHR(RFLX$WRD,3)*RFLXGR),4) ;
       -         /* RFLX=RFLX*RFLXGR IF IN REGEN   */
111      5                             ELSE RFLX$WRD = SHR((SHR(RFLX$WRD,3)*RFLXGM),4) ;
       -         /* ELSE RFLX=RFLX*RFLXGM          */
112      5                             IF RFLX$WRD > 665H THEN RFLX$WRD = 665H ;
       -         /* CLAMP AT 8VOLTS              */

-         /* RFLX IS NOW VALID            */
114      5                             RFERR$INT, TMP$INT2 = (FLUX$INT - INT(RFLX$WRD)) ;
       -         /* COMPARE FLUX TO RFLX         */
115      5                             IF (RFERR$WRD AND NEG$SIGN ) = NEG$SIGN
       -         /* RCOMP = RCOMP -(RCOMP*RBLEED) */
```

```
117  6                              THEN DO ;          /*    + (RFERR$WRD*RERRG)         */
118  6                                  SIGN = SET ;
119  6                                  TMP$INT2 = - TMP$INT2 ;
                                        END ;
120  5                              ELSE SIGN = RESET ;
121  5                              REMAINDER1 = (LOW(TMP$WRD2)*RERRG) + LOW(REMAINDER1) ;
     -  /* TMP$INT1 = (RFERR * RERRG)       */
122  5                              TMP$WRD1   = (HIGH(TMP$WRD2) * RERRG) + HIGH(REMAINDER1)
     -  + REMAINDER2 ;
123  5                              REMAINDER2 = TMP$WRD1 AND 1FH ;
124  5                              TMP$WRD1   = SHR (TMP$WRD1 ,5 ) ;
     -
125  5                              IF SIGN   = SET THEN TMP$INT1 = -TMP$INT1 ;

127  5                              REMAINDER3 = (LOW(RCOMP$WRD) * RBLEED) + LOW(REMAINDER3)
     -  ;/* TMP$INT2 = (RCOMP * RBLEED)     */
128  5                              TMP$WRD2   = (HIGH(RCOMP$WRD) * RBLEED) + HIGH(REMAINDER
     -  ) + REMAINDER4;
129  5                              REMAINDER4 = TMP$WRD2 AND 1FH ;
130  5                              TMP$WRD2   = SHR ( TMP$WRD2 , 5 ) ;
     -  /* RBLEED IS ALWAYS POSITIVE HERE */
131  5                              IF REGEN= SET          /* IF REGEN REVERSE SIGNAL SIGN  */
                                        THEN DO ;
133  6                                  TMP$INT1 = -TMP$INT1 ;
     -  /* RFERR  = - RFERR              */
134  6                                  TMP$INT2 = -TMP$INT2 ;
     -  /* RBLEED = - RBLEED             */
135  6                                  END ;
136  5                              RCOMP$INT = RCOMP$INT + TMP$INT1 - TMP$INT2 ;
     -  /* RCOMP = RCOMP + ERROR - BLEED */
137  5                              IF ((OLD$REGEN = SET ) AND ( REGEN = RESET ))
     -  /* RCOMP = RCOMP - 1/8 * RCOMP  */
                                        THEN RCOMP$WRD = RCOMP$WRD - SHR(RCOMP$WRD,3);
     -  /* IF DRIVE JUST WENT MOTORING    */
139  5                              IF (( OLD$REGEN = RESET ) AND ( REGEN = SET ))
     -  /* RCOMP = RCOMP + 1/8 * RCOMP  */
                                        THEN RCOMP$WRD = RCOMP$WRD + SHR(RCOMP$WRD,3);
     -  /* IF DRIVE JUST WENT REGEN       */
141  5                              END ;
142  4                          END ;
143  3                      END ;
144  2              IF RCOMP$WRD > (RIDLE+925) THEN RCOMP$WRD = RIDLE+925 ;
     -  /* CLAMP WITHIN IDLE VALUE OF R    */
146  2              IF RCOMP$WRD < (RIDLE-SHR(RIDLE,4)) THEN RCOMP$WRD = RIDLE-SHR(RIDLE,4);
     -  /* AND IDLER + 4.5 VOLTS           */
148  2              RCMP$0$7 = HIGH(LOW(RCOMP$WRD)*RSCALE) + HIGH(RCOMP$WRD)*RSCALE ;
     -  /* GET 8BIT RCOMP$0$7 FROM RCOMP   */
149  2              IF RCMP$0$7 > 255 THEN RCMP$0$7 = 255 ;
151  2              END RESISTANCE$CALC ;
152  1          END    BERESI ;
```

PL/M-86 COMPILER    BE295B  AC EXCAVATOR CODE FOR BE MINING SHOV  05/09/83 14:44:49  PAGE  7
                    BERESI  RESISTANCE CALCULATOR FOR PROPEL OPERATION

```
        $EJECT

MODULE INFORMATION:

CODE AREA SIZE     = 040FH    1039D
        CONSTANT AREA SIZE = 0000H       0D
        VARIABLE AREA SIZE = 0021H      33D
        MAXIMUM STACK SIZE = 0006H       6D
        254 LINES READ
        0 PROGRAM WARNINGS
        0 PROGRAM ERRORS

END OF PL/M-86 COMPILATION $
```